(12) United States Patent
Karasawa

(10) Patent No.: US 12,316,247 B2
(45) Date of Patent: May 27, 2025

(54) VIBRATION WAVE DRIVING APPARATUS

(71) Applicant: CANON KABUSHIKI KAISHA, Tokyo (JP)

(72) Inventor: Kohei Karasawa, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 647 days.

(21) Appl. No.: 17/582,124

(22) Filed: Jan. 24, 2022

(65) Prior Publication Data

US 2022/0239237 A1   Jul. 28, 2022

(30) Foreign Application Priority Data

Jan. 27, 2021   (JP) .................................. 2021-011537

(51) Int. Cl.
| | | |
|---|---|---|
| H02N 2/00 | (2006.01) | |
| G02B 7/04 | (2021.01) | |
| H02N 2/12 | (2006.01) | |
| H10N 30/20 | (2023.01) | |

(52) U.S. Cl.
CPC ............... H02N 2/001 (2013.01); G02B 7/04 (2013.01); H02N 2/12 (2013.01); H10N 30/20 (2023.02)

(58) Field of Classification Search
CPC .......... G02B 7/04; H01N 30/20; H02N 2/001; H02N 2/12

USPC ......................................................... 359/824
See application file for complete search history.

(56) References Cited

U.S. PATENT DOCUMENTS

| | | | |
|---|---|---|---|
| 2019/0278185 A1* | 9/2019 | Morimoto | ............ G02B 27/646 |
| 2020/0052614 A1 | 2/2020 | Kimura | |

FOREIGN PATENT DOCUMENTS

| | | |
|---|---|---|
| JP | H04312368 A | 11/1992 |
| JP | H06121560 A | 4/1994 |
| JP | H06153541 A | 5/1994 |
| JP | 2010158127 A | 7/2010 |
| JP | 2016019354 A | 2/2016 |
| JP | 2019039997 A | 3/2019 |
| JP | 2020028217 A | 2/2020 |
| KR | 1020120129058 A | 11/2012 |

* cited by examiner

*Primary Examiner* — Wyatt A Stoffa
*Assistant Examiner* — Grant A Gagnon
(74) *Attorney, Agent, or Firm* — ROSSI, KIMMS & McDOWELL LLP

(57) ABSTRACT

A vibration wave driving apparatus includes a vibrator configured to vibrate and movable relative to a friction member to generate a driving force, a pressing member configured to pressurize the vibrator, a transmission member configured to transmit a pressing force by the pressing member to the vibrator, a holding member configured to hold the vibrator, and a viscoelastic member configured to connect the holding member and the transmission member to each other.

10 Claims, 12 Drawing Sheets

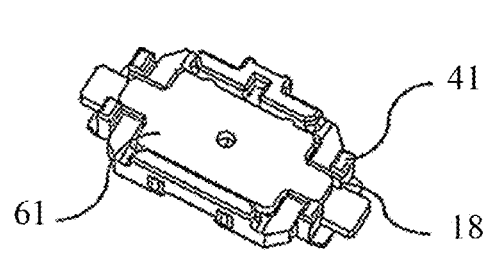
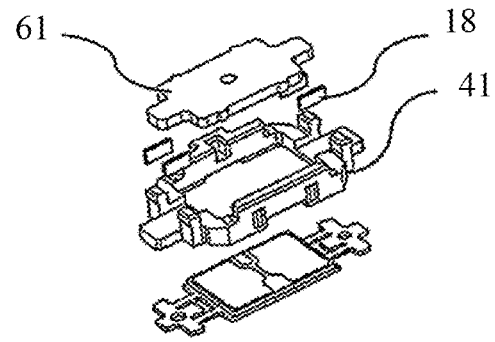
FIG. 1A  FIG. 1B
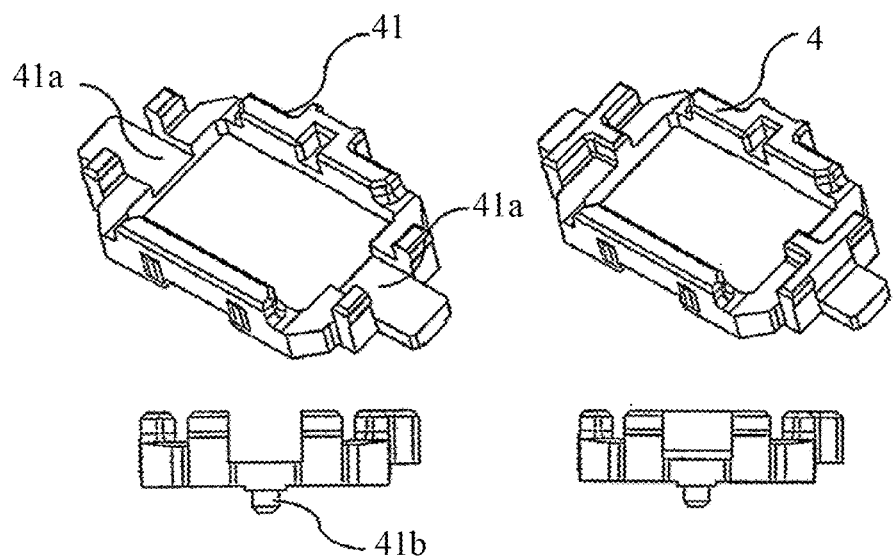
FIG. 2A  FIG. 2B

PRIOR ART

PRIOR ART

PRIOR ART

VIBRATION WAVE DRIVING APPARATUS

BACKGROUND OF THE INVENTION

Field of the Invention

The present invention relates to a vibration wave driving apparatus, which is suitable for a lens interchangeable type digital single-lens reflex camera, a digital still camera, a digital video camera, a lens interchangeable type digital video camera, etc.

Description of the Related Art

In driving a vibration wave driving apparatus (ultrasonic motor) that has a driving source in deformations of a piezoelectric element, the vibration generated by the friction contact between a vibrator and a friction member may be transmitted to a holding member that holds the vibrator, and may cause the rocking vibration and the abnormal noise. Japanese Patent Laid-Open No. ("JP") 2016-19354 discloses a vibration wave driving apparatus that includes a damper member provided between the vibrator and the holding member. JP 2010-158127 discloses a vibration wave driving apparatus that includes a vibration suppressing member that suppresses the unnecessary vibration from the vibrator.

The vibration wave driving apparatus disclosed in JP 2016-19354 directly pressurizes the holding member, the piezoelectric element may be separated from the vibrator, and the driving characteristic may deteriorate. The vibration wave driving apparatus disclosed in JP 2010-158127 cannot suppress the vibration of the holding member and may cause abnormal noise.

SUMMARY OF THE INVENTION

The present invention provides a vibration wave driving apparatus that can maintain a good driving characteristic while suppressing the vibration of a holding member that holds a vibrator.

A vibration wave driving apparatus according to one aspect of the present invention includes a vibrator configured to vibrate and movable relative to a friction member to generate a driving force, a pressing member configured to pressurize the vibrator, a transmission member configured to transmit a pressing force by the pressing member to the vibrator, a holding member configured to hold the vibrator, and a viscoelastic member configured to connect the holding member and the transmission member to each other. An apparatus according to another aspect of the present invention includes the above vibration wave driving apparatus, and a driven member driven by a driving force from the vibration wave driving apparatus.

Further features of the present invention will become apparent from the following description of exemplary embodiments with reference to the attached drawings.

BRIEF DESCRIPTION OF THE DRAWINGS

FIGS. 1A and 1B explain a holding member and its surrounding members according to the first embodiment.

FIGS. 2A and 2B compare the holding member according to the first embodiment and a conventional holding member.

DESCRIPTION OF THE EMBODIMENTS

Figure 3A:
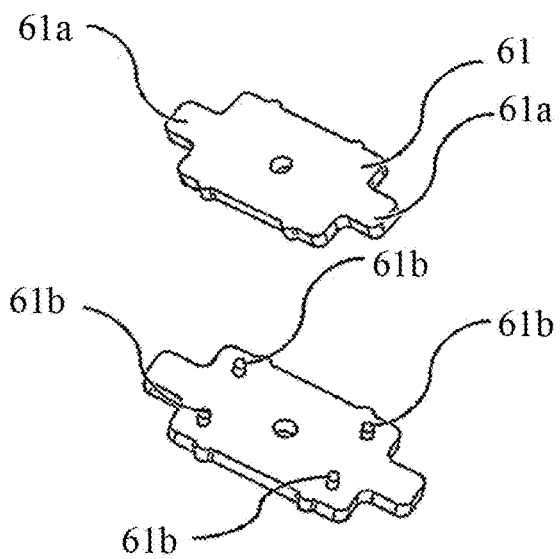
FIGS. 3A and 3B compare a transmission member according to the first embodiment and a conventional transmission member.

Referring now to the accompanying drawings, a detailed description will be given of embodiments according to the present invention. Corresponding elements in respective figures will be designated by the same reference numerals, and a duplicate description thereof will be omitted.

In each embodiment, an X-axis direction is set to a direction in which a vibrator and a friction member move relative to each other, a Y-axis direction is set to a direction (pressurizing direction) orthogonal to the X-axis direction, in which the vibrator is pressurized against the friction member, and a Z-axis direction is a direction orthogonal to the X-axis direction and the Y-axis direction. The coordinate system in each embodiment is set for description purposes, and the present invention is not limited to this definition.

Referring now to FIGS. 12 to 15, a description will be given of a problem of the conventional vibration wave driving apparatus. FIGS. 12 to 15 are a perspective view, a sectional view of a driving force extractor, an exploded perspective view, and a sectional view in the X-axis direction of a conventional vibration wave driving apparatus 1000, respectively.

The vibration wave driving apparatus 1000 is a direct action type linear actuator, and generates a driving force in the X-axis direction. A connecting protrusion 17a of a driven member 17 is inserted into a groove-shaped driving force extractor 16a of a move plate 16. Thereby, the vibration wave driving apparatus 1000 is connected to the driven member 17 and can drive the driven member 17 in the X-axis direction.

A tension coil spring 7 urges a pressure plate 8 in the Y-axis direction. A transmission member 6 receives a pressing force from the pressure plate 8 (pressing member) toward the piezoelectric element 1 in the Y-axis direction, and transmits the pressing force to a vibrator 3 via a felt 5.

Figure 4A:
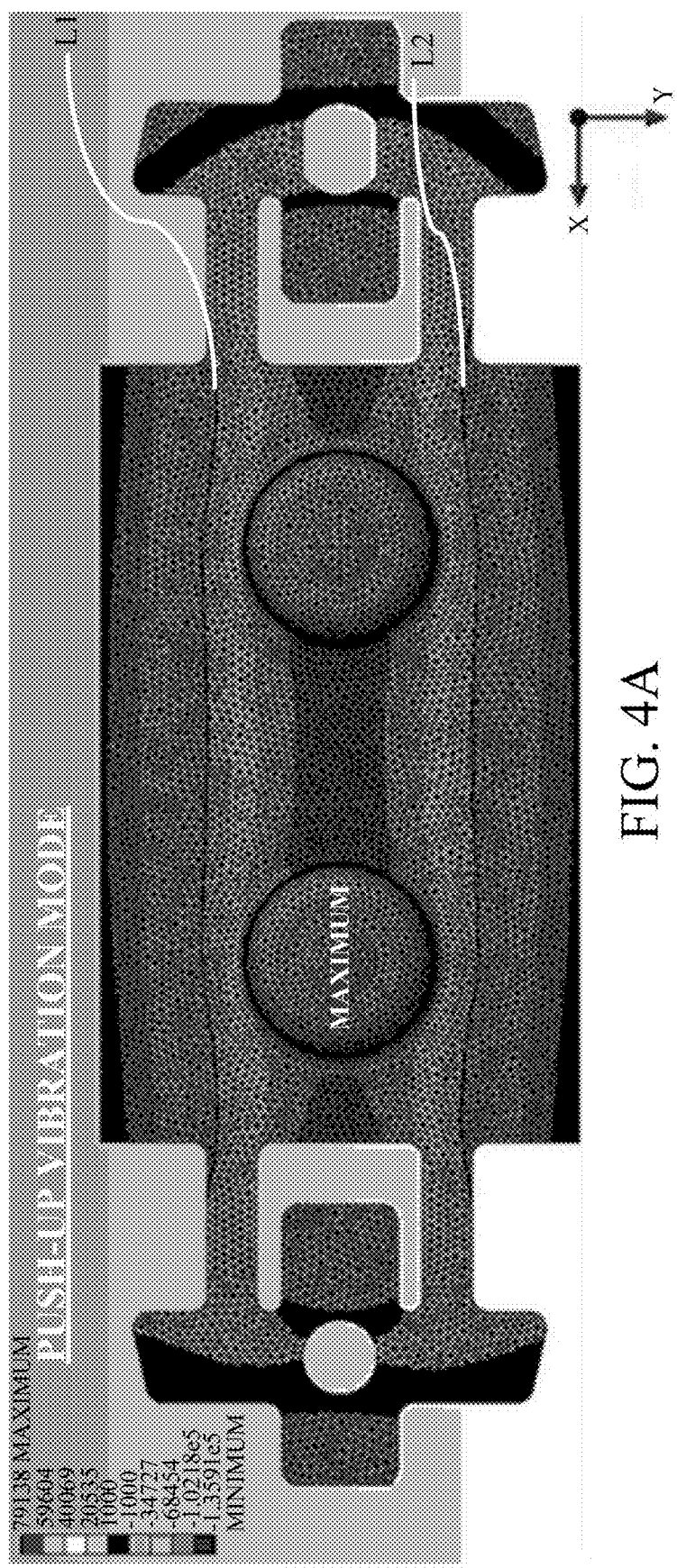
FIGS. 4A to 4C explain vibration modes of a vibrator.
Figure 4B:
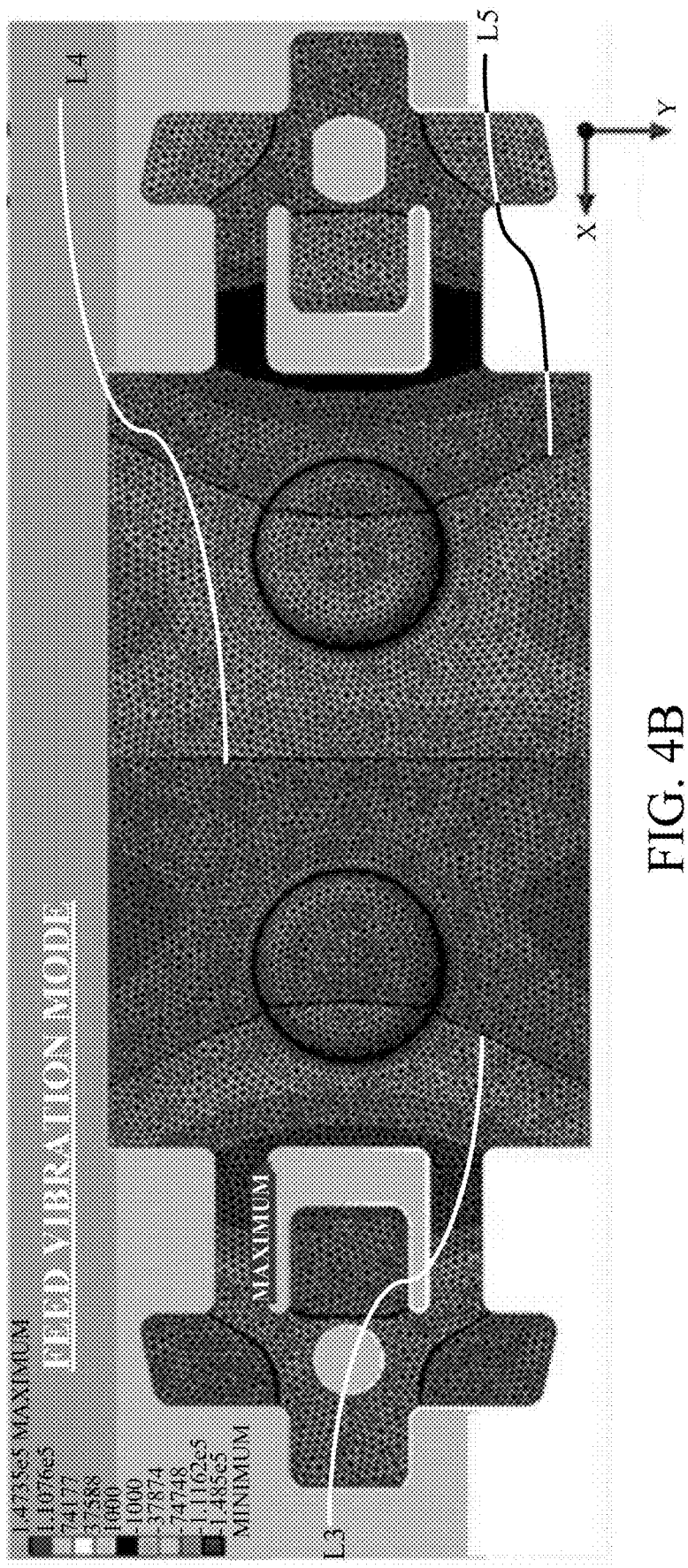

A description will now be given of a mechanism by which the vibration wave driving apparatus 1000 generates the driving force. The vibration wave driving apparatus 1000 includes the vibrator 3 that includes a piezoelectric element 1 and a boss plate 2 fixed to each other by an adhesive or the like. A flexible substrate 12 is mechanically and electrically connected to the piezoelectric element 1 with an anisotropic conductive paste or the like. The piezoelectric element 1 is provided with two electrodes. When two-phase high-frequency voltages having different phases are applied to the two electrodes, the vibrator 3 generates two vibration modes illustrated in FIGS. 4A and 4B. FIG. 4A illustrates a deformed state of the vibrator 3 in a push-up vibration mode in which the vibrator 3 generates a bending vibration in the Y-axis direction. The tint represents a change in the Y-axis direction. In the push-up vibration mode, the vibrator 3 generates a primary bending deformation (having two vibration nodes) in the short side direction of a central rectangular portion that is a joint with the piezoelectric element 1 and does not deform (or has no vibration nodes) in the long side direction. FIG. 4B illustrates a deformed state of the vibrator 3 in a feed vibration mode in which the vibrator 3 shows a secondary bending deformation (having three vibration nodes) in the long side direction of the rectangular portion and does not deform (or has no vibration nodes) in the short side direction. When the voltages are applied to the two electrodes of the piezoelectric element 1 with a temporal phase difference of $\pi/2$, the two vibration modes are temporally shifted and overlap each other, and an elliptical motion occurs at projections (convex portions) of the boss plate 2. By changing the frequency and phase of the high-frequency voltages applied to the piezoelectric element 1, the rotation direction and elliptic ratio of the elliptical motion can be properly changed, and the vibrator 3 can be made to move as desired. The vibrator 3 can generate a driving force that moves relative to a friction member 14 by a frictional contact with the friction member 14 fixed to a base member 13. That is, the vibrator 3 can move relative to the friction member 14 in the X-axis direction. A ball base 15 is disposed on the opposite side of the vibrator 3 with respect to the friction member 14. Three rolling balls (not shown) are disposed between the ball base 15 and the move plate 16.

A description will now be given of a connection between the holding member 4 that holds the vibrator 3 and a holding member holding frame 11. The boss plate 2 has two holes 2b separated from each other in the X-axis direction. The holding member 4 has fixing pins 4a facing the two holes 2b. The pin 4a is inserted into the hole 2b and then fixed with an adhesive or the like. The holding member holding frame 11 is connected to the move plate 16 by a screw and engaged with the holding member 4.

At each end of the holding member 4 in the X-axis direction, the holding member 4 is disposed inside roller members 9 and the holding member holding frame 11 is disposed outside the roller members 9. A leaf spring 10 is fixed to the holding member holding frame 11 by an adhesive or the like, and urges the holding member 4 in the X-axis direction via the roller member 9. That is, the holding member 4 is urged to the holding member holding frame 11 via the roller members 9. The holding member 4 is not only urged in the X-axis direction, but also moved in the Y-axis direction by rolling of the roller members 9. That is, the holding member holding frame 11 can be equalized in the X-axis direction and the Y-axis direction.

Due to the above structure, in the connection between the holding member 4 and the holding member holding frame 11, there is no play in the X-axis direction that is the driving direction, and there is almost no sliding resistance due to the rolling action of the rolling member 9 in the Y-axis direction.

In the conventional vibration wave driving apparatus 1000, the sliding resistance in the Y-axis direction is hardly generated in the holding member 4. Therefore, when the vibration is excited due to vibration or the like from another member, the rocking vibration is generated in the arrow direction in FIG. 15 in the holding member 4.

First Embodiment

FIGS. 1A and 1B explain a holding member and its surrounding members according to this embodiment. FIGS. 1A and 1B are a perspective view and an exploded perspective view of the holding member and its surrounding members, respectively. The components in this embodiment, which are corresponding components in the prior art, will be designated by the same reference numerals, and a detailed description thereof will be omitted.

The vibration wave driving apparatus 100 according to this embodiment includes a holding member 41 and a transmission member 61 having shapes different from those of the conventional holding member 4 and the conventional transmission member 6. The vibration wave driving apparatus 100 according to this embodiment further includes viscoelastic members 18.

The transmission member 61 directly transmits the pressing force to the piezoelectric element 1. The viscoelastic member 18 connects the holding member 41 and the transmission member 61 to each other. The viscoelastic member 18 is a member having a high damping property, and is made, for example, of an adhesive or butyl rubber using an elastomer system as a main component.

Figure 3B:
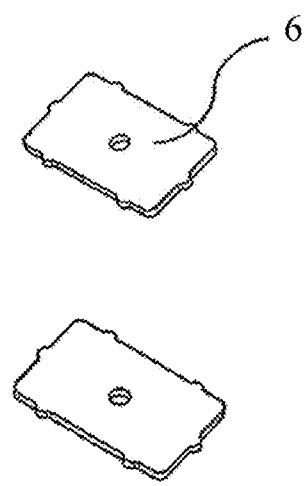

FIGS. 2A and 2B compare the holding member 41 according to this embodiment and the conventional holding member 4. FIGS. 2A and 2B illustrate the holding member 41 according to this embodiment and the conventional holding member 4, respectively. In FIGS. 2A and 2B, an upper figure is a perspective view and a lower figure is a side view. FIGS. 3A and 3B compare the transmission member 61 according to this embodiment and the conventional transmission member 6. FIGS. 3A and 3B illustrate the transmission member 61 according to this embodiment and the conventional transmission member 6, respectively. In FIGS. 3A and 3B, the upper figure is an illustration viewed from the + side in the Y-axis direction, and the lower figure is an illustration viewed from the − side in the Y-axis direction.

The holding member 41 has a notch portion (connector) 41a having a concave shape when viewed from the X-axis direction (first direction). The transmission member 61 includes an arm portion 61a that fits into the notch portion 41a with a certain gap. Four convex portions 61b that come into contact with the vibrator 3 are provided on the surface of the transmission member 61 on the piezoelectric element 1 side.

Figure 4C:
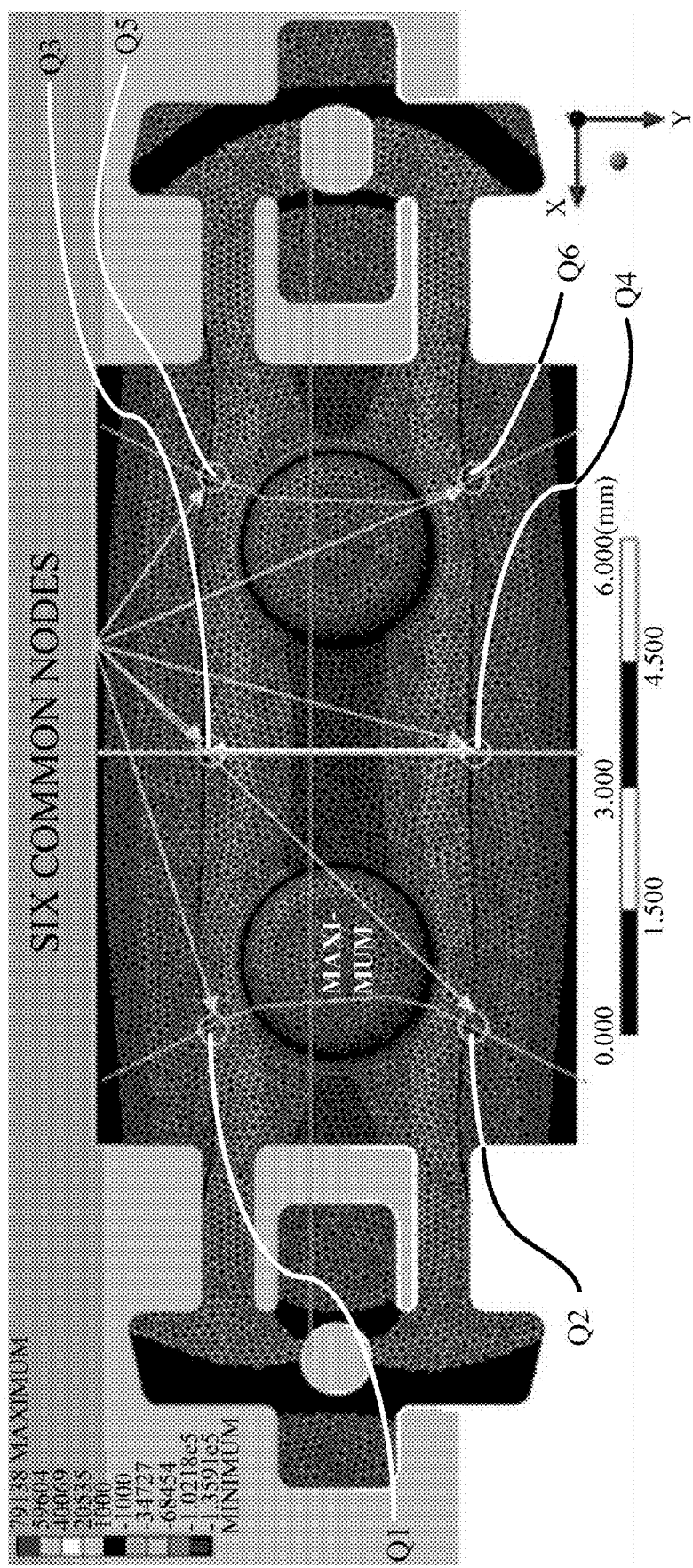

Referring now to FIGS. 4A to 4C, a description will be given of the positions of the convex portions 61b. FIG. 4C illustrates common nodes in which nodes in a plurality of standing wave vibrations excited by the vibrator 3 in the two vibration modes of the vibrator 3 intersect and overlap each other. In FIG. 4A, the center of the vibrator 3 is a portion (vibration antinode) that has a maximum displacement of the bending vibration (the largest vibration amplitude). The portions that are illustrated by L1 and L2 in FIG. 4A are portions (vibration nodes) in which the displacement in the bending vibration is almost zero. In a case where these nodes exist at points, they are also called node points. In the vibration of the rectangular plate as in this embodiment, the nodes are formed in a line shape instead of the points and thus these nodes in the present invention will be particularly referred to as a node line (in a case where the vibration plate has a disk shape, the node line formed in the radial direction becomes concentric and thus will be referred to as a node circle in this case). The node lines L3 to L5 in FIG. 4B are formed along the directions orthogonal to the node lines L1 and L2. FIG. 4C illustrates the node lines L1 to L5 of the two vibration modes. The intersections between the node lines L1 and L2 and the node lines L3 to L5, that is, common nodes of the two vibration modes are the common nodes Q1 to Q6. The convex portion 61b is located at any one of the positions of the common nodes Q1 to Q6. In this embodiment, the convex portions 61b are located at the positions of the common nodes Q1, Q2, Q5, and Q6. Q3 and Q4 serve as support portions of the vibrator 3.

Figure 5:
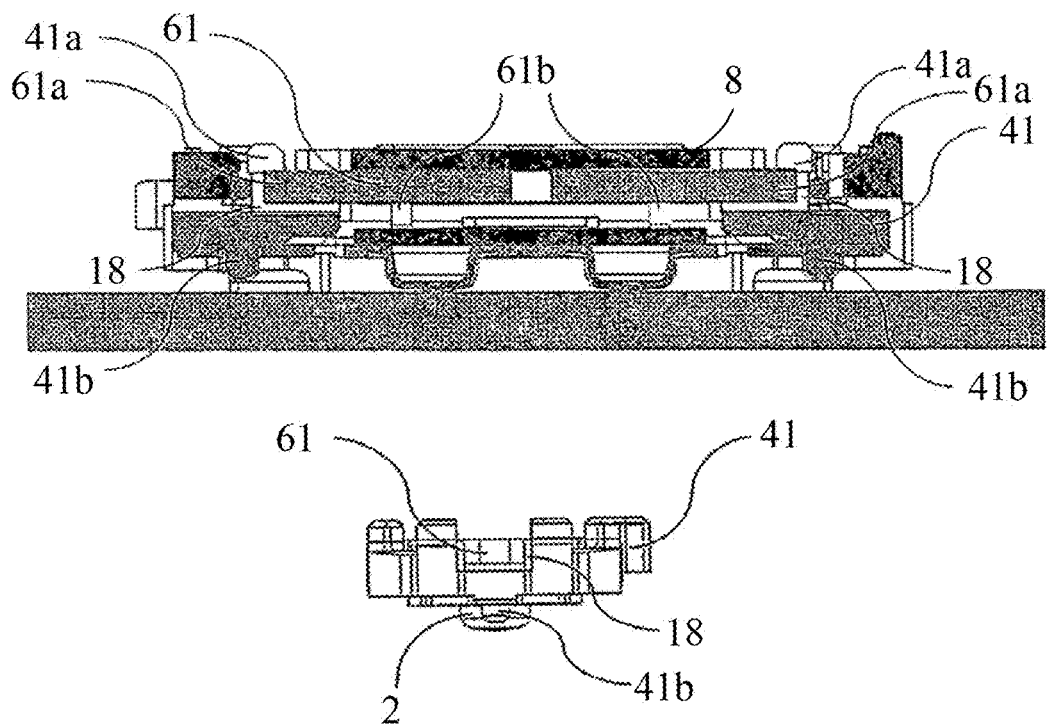
FIG. 5 is a sectional view of a vibration wave driving apparatus according to the first embodiment.

Referring now to FIGS. 1A, 1B, and 5, a description will be given of the effect of the structure according to this embodiment. FIG. 5 is a sectional view of the vibration wave driving apparatus 100. In this embodiment, the transmission member 61 directly pressurizes common nodes different from those of the support portion of the vibrator 3 among the common nodes to the two vibration modes of the vibrator 3. The transmission member 61 receives a pressing force from the pressure plate 8 toward the piezoelectric element 1 in the Y-axis direction, and transmits the pressing force to the piezoelectric element 1 via the convex portions 61b. Since the convex portions 61b contact the common nodes of the vibrator 3, the transmission member 61 can pressurize the vibrator 3 without being affected by the vibration. Thereby, the transmission member 61 can become stable. In this embodiment, the common nodes Q1, Q2, Q5, and Q6 on both sides of the vibrator 3, that is, the common nodes disposed symmetrically with respect to the centerline in the short side direction of the vibrator 3 are pressurized. Thereby, the transmission member 61 can transmit the pressing force over the entire area of the vibrator 3, so that deterioration of the driving characteristics can be suppressed.

As described above, the transmission member 61 is substantially integrated with the vibrator 3 and is stable during driving, so that it serves as a damper together with the viscoelastic member 18. This structure can suppress the rocking vibration of the holding member 41 and the abnormal noise.

This embodiment provides four convex portions 61b, but the present invention is not limited to this embodiment. A number may be provided that can stabilize the transmission member 61, that is, there may be at least three or more convex portions 61b. In this embodiment, the common nodes Q1, Q2, Q5, and Q6 are pressurized, but the present invention is not limited to this embodiment. In order to transmit the pressing force over the entire area of the vibrator 3, the common nodes may be pressed which are disposed symmetrically with respect to the center line in the short side direction of the vibrator 3. Such common nodes may include common nodes close to both ends in the long side direction of the vibrator 3.

A description will now be given of the position where the viscoelastic member 18 connects the holding member 41 and the transmission member 61 to each other. The viscoelastic member 18 connects the side surface of the arm portion 61a of the transmission member 61 and the side surface of the notched portion 41a of the holding member 41 to each other. That is, the viscoelastic member 18 is disposed between the holding member 41 and the transmission member 61 in the Z-axis direction (second direction). Thereby, even in a case where a member that shrinks after the application such as a silicone resin adhesive is used for the viscoelastic member 18, the force due to the shrinkage acts on the side surface, and no forces are applied to the pins 41b of the holding member 41 and the holes 2b in the boss plate 2. Thus, the deterioration of the driving characteristic due to peeling of the piezoelectric element 1 and the boss plate 2 etc. can be suppressed. The viscoelastic member 18 may be provided so as to connect the holding member 41 and the pressure plate 8 to each other. This structure can further suppress the vibration of the holding member 41.

Figures 6A, 6B:
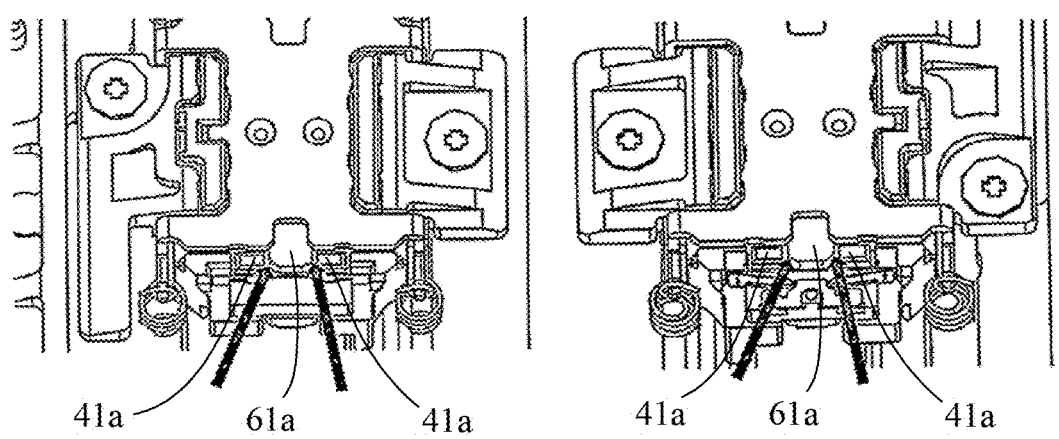
FIGS. 6A and 6B illustrate positions at which viscoelastic members according to the first embodiment are to be disposed.

In this embodiment, after each member is assembled, the viscoelastic members 18 are disposed at positions indicated by arrows in FIG. 6A that illustrates part of the vibration wave driving apparatus viewed from one side in the moving direction, and at positions indicated by arrows in FIG. 6B that illustrates part of the vibration wave driving apparatus viewed from the other side in the moving direction.

That is, after it is confirmed that the transmission member 61 receives the pressing force and is stable, the viscoelastic member 18 connects the holding member 41 and the transmission member 61 to each other. This structure can remove factors that deteriorate the driving characteristic such as the transmission member 61 connected in an inclined state.

Second Embodiment

Figure 7A:
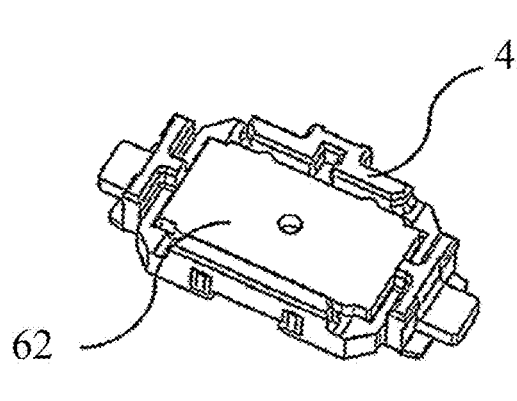
FIGS. 7A and 7B explain a holding member and its surrounding members according to a second embodiment.
Figure 7B:
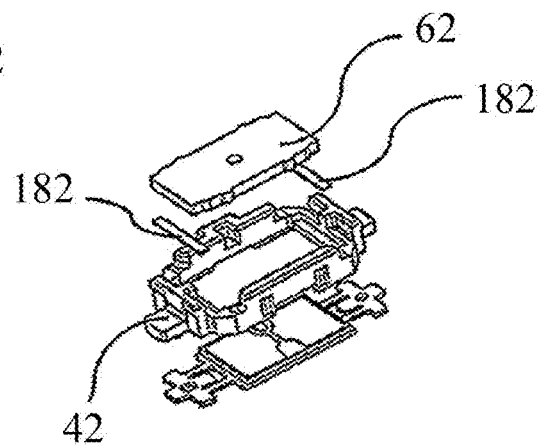

FIGS. 7A and 7B explain the holding member 42 and its surrounding members in this embodiment. FIGS. 7A and 7B are a perspective view and an exploded perspective view of the holding member 42 and its surrounding members, respectively. This embodiment will discuss changes from the first embodiment. In this embodiment, the same reference numerals are given to structures according to the first embodiment corresponding to the conventional structures, and a detailed description thereof will be omitted.

The vibration wave driving apparatus 100 according to this embodiment includes a holding member 42, a transmission member 62, and a viscoelastic member 182 having shapes different from those of the holding member 41, the transmission member 61, and the viscoelastic member 18 of the first embodiment.

Figure 8A:
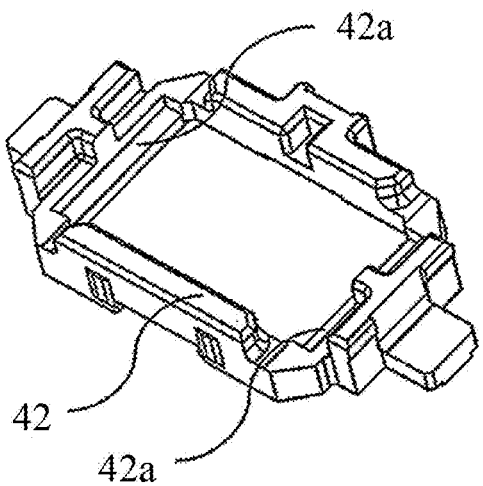
FIGS. 8A and 8B compare the holding member according to the second embodiment and a conventional holding member.
Figure 8B:
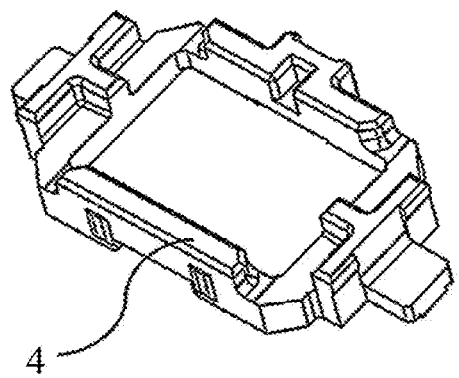
Figures 9A, 9B:
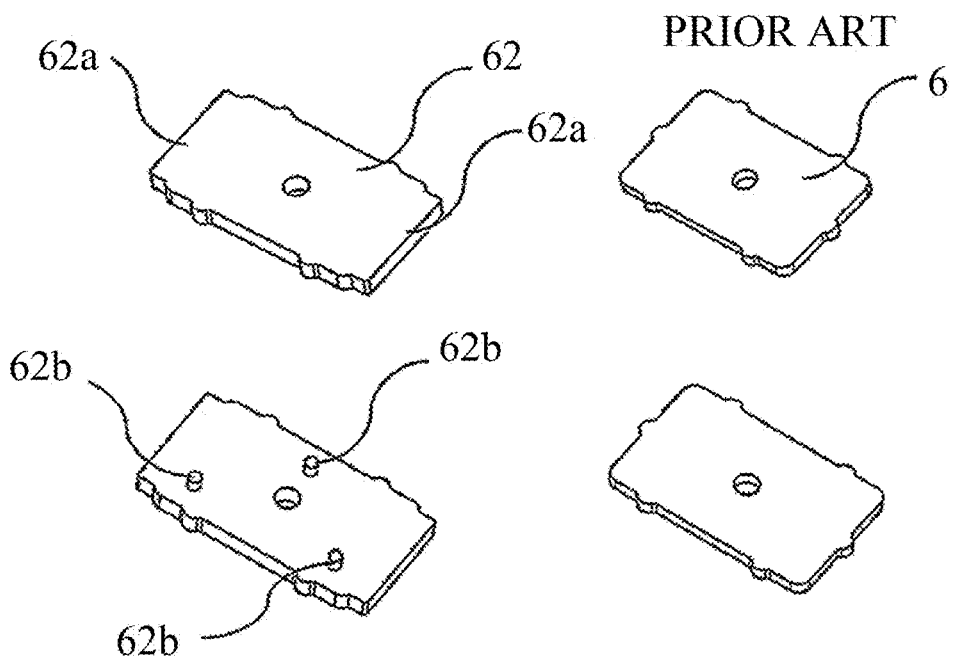
FIGS. 9A and 9B compare a transmission member according to the second embodiment and a conventional transmission member.

FIGS. 8A and 8B compare the holding member 42 according to this embodiment and the conventional holding member 4. FIGS. 8A and 8B illustrate the holding member 42 according to this embodiment and the conventional holding member 4, respectively. FIGS. 9A and 9B compare the transmission member 62 according to this embodiment and the conventional transmission member 6. FIGS. 9A and 9B illustrate the transmission member 62 according to this embodiment and the conventional transmission member 6, respectively. In FIGS. 9A and 9B, the upper figure is an illustration viewed from the + side in the Y-axis direction, and the lower figure is an illustration viewed from the − side in the Y-axis direction.

The holding member 42 has groove portions (connectors) 42a with a shape configured to accommodate the viscoelastic member 182 on the XZ plane orthogonal to the Y-axis direction along the Z-axis direction. The transmission member 62 has a rectangular portion 62a that fits into the groove portion 42a with a certain gap. Three convex portions 62b are provided on the surface of the transmission member 62 on the side of the piezoelectric element 1. In this embodiment, the convex portions 62b pressurize the common nodes Q1, Q4, and Q5 illustrated in FIG. 4C.

Figure 10:
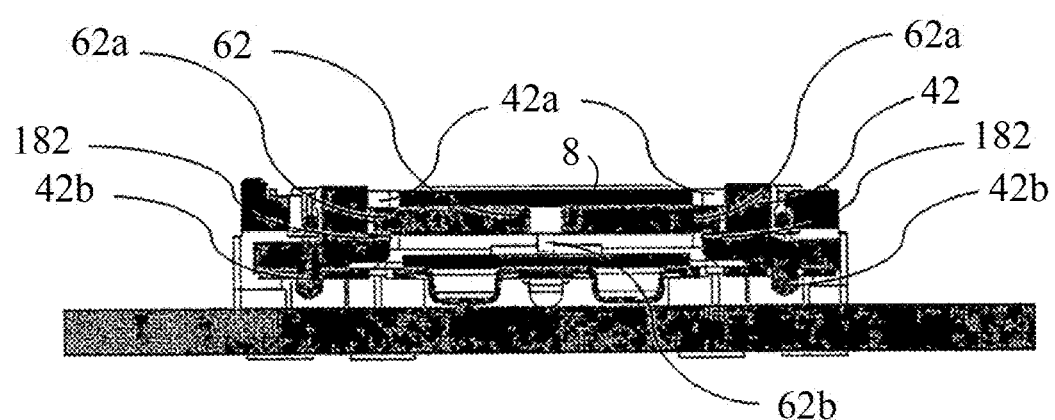
FIG. 10 is a sectional view of a vibration wave driving apparatus according to the second embodiment.

In this embodiment, a method of assembling the vibration wave driving apparatus 100 is different from that of the first embodiment. Referring now to FIGS. 7A, 7B, and 10, a description will be given of a method of assembling the vibration wave driving apparatus 100 according to this embodiment. FIG. 10 is a sectional view of the vibration wave driving apparatus 100 according to this embodiment. In this embodiment, the viscoelastic member 182 is disposed between the holding member 42 and the transmission member 62 in the Y-axis direction. In this embodiment, the viscoelastic member 182 is made of a material such as urethane rubber, which has a high damping property and does not shrink, and whose thickness in the Y-axis direction is adjustable. Once the thickness of the viscoelastic member 182 is controlled so that the convex portions 62b of the transmission member 62 definitely contact the piezoelectric element 1, it is unnecessary to insert the viscoelastic member 182 into a space between the holding member 42 and the transmission member 62 at the end of the assembly. That is, since the viscoelastic member 182 can be disposed in advance in the groove portion 42a of the holding member 42, the assembling property can be improved. Since the unshrinkable viscoelastic member 182 is used, no unnecessary force is applied to the pins 42b of the holding member 42 and the holes 2b in the boss plate 2, and the deterioration of the driving characteristic can be suppressed due to peeling between the piezoelectric element 1 and the boss plate 2 or the like.

Third Embodiment

Figure 11:
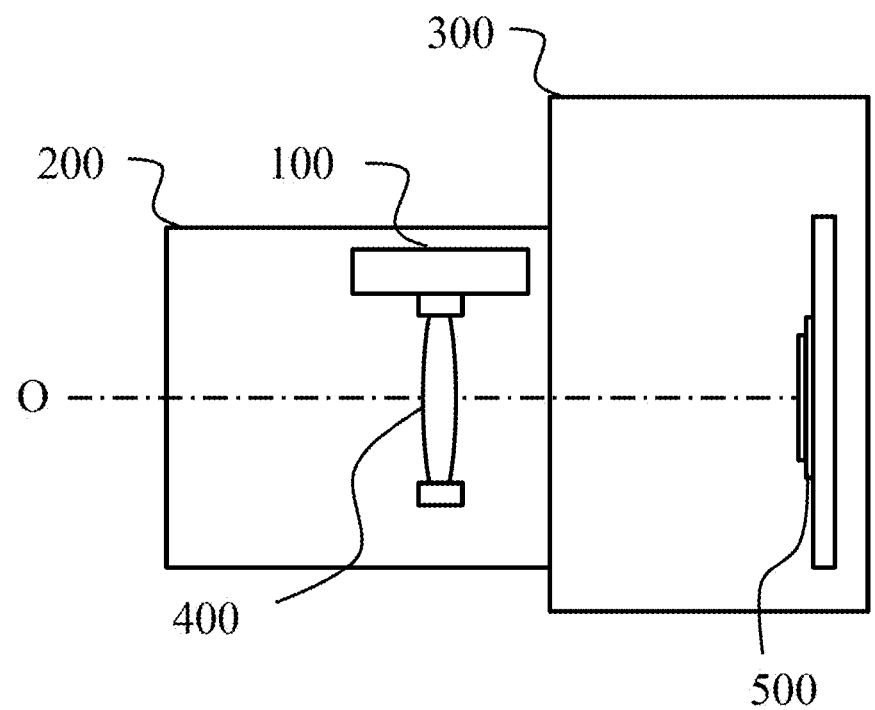
FIG. 11 is a sectional view of an image pickup apparatus according to a third embodiment.
Figure 12:
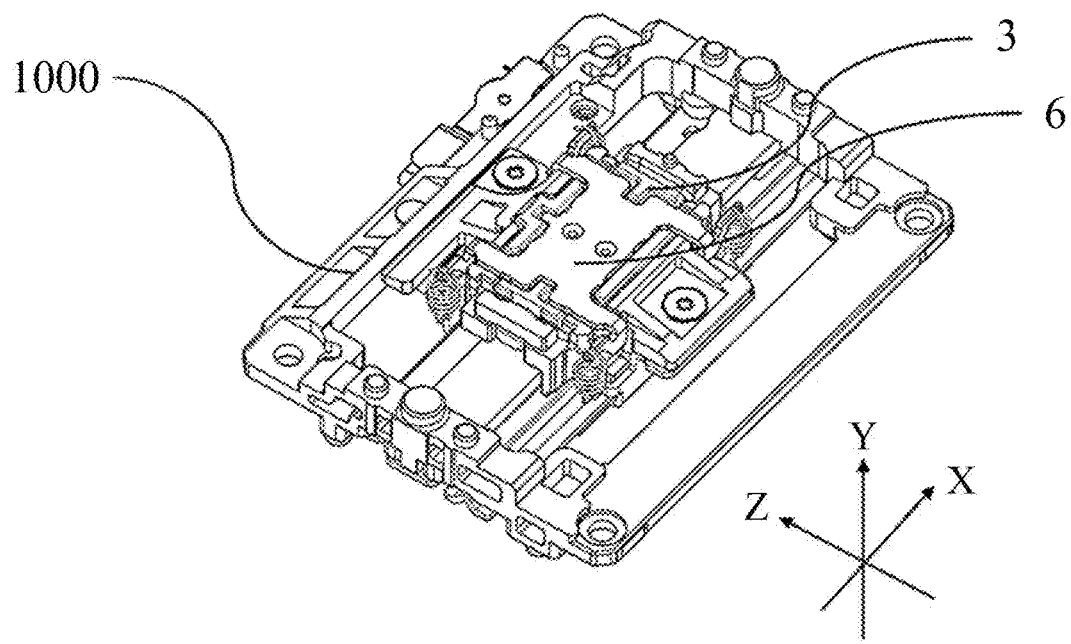
FIG. 12 is a perspective view of a conventional vibration wave driving apparatus.
Figure 13:
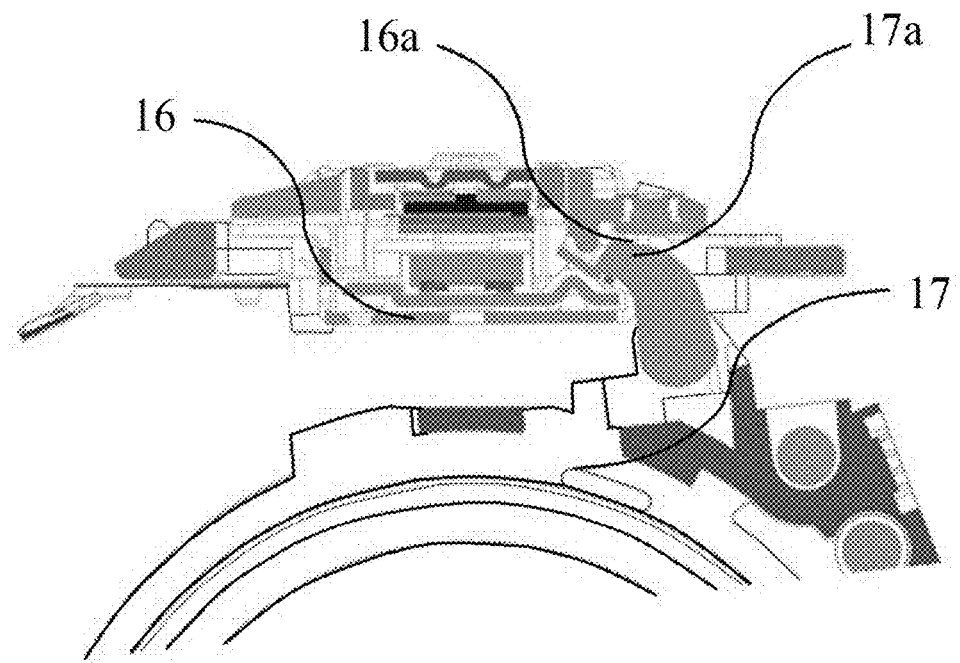
FIG. 13 is a sectional view of a driving force extractor in the conventional vibration wave driving apparatus.
Figure 14:
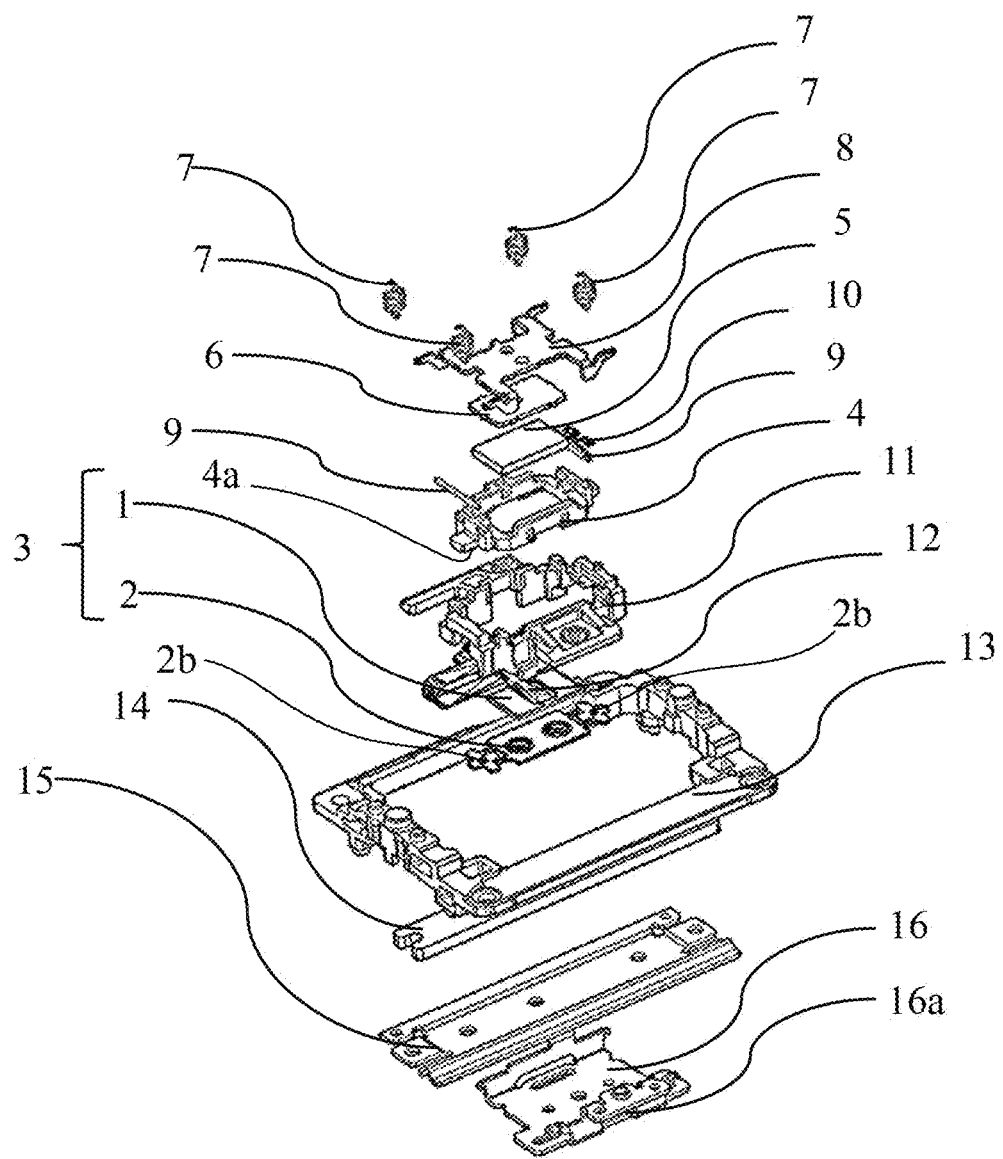
FIG. 14 is an exploded perspective view of the conventional vibration wave driving apparatus.
Figure 15:
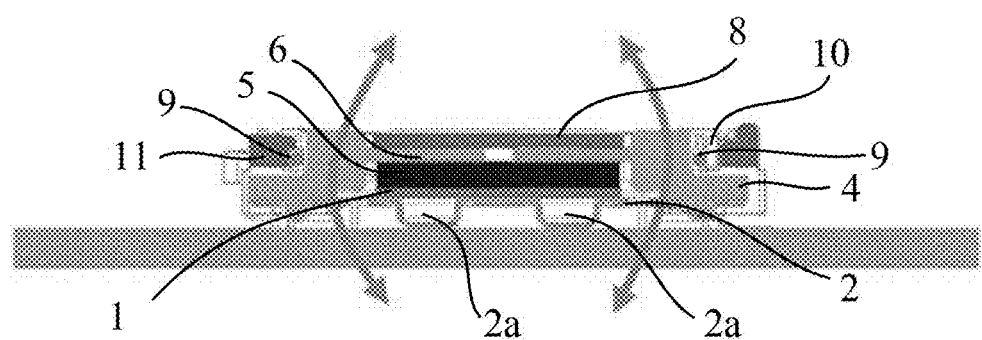
FIG. 15 is a sectional view of a conventional vibration wave driving apparatus.

FIG. 11 is a sectional view of an image pickup apparatus (optical apparatus) that includes the vibration wave driving apparatus 100 according to the first or second embodiment. The image pickup apparatus according to this embodiment includes an imaging lens unit 200 and a camera body 300. Inside the imaging lens unit 200, the vibration wave driving apparatus 100 and a focus lens 400 attached to the vibration wave driving apparatus 100 are disposed. An image sensor 500 is disposed inside the camera body 300. The focus lens 400 is moved along an optical axis O by the vibration wave driving apparatus 100 during imaging. An object image is imaged at the position of the image sensor 500, and the image sensor 500 generates an in-focus image. In this embodiment, the vibration wave driving apparatus 100 is mounted on the image pickup apparatus, but the present invention is not limited to this embodiment. The vibration wave driving apparatus 100 may be mounted on another optical apparatus such as a lens unit, or may be mounted on an apparatus different from the optical apparatus. In this embodiment, the imaging lens unit 200 and the camera body 300 are integrated with each other, but the present invention is not limited to this embodiment. The imaging lens unit 200 may be attachable to and detachable from the camera body 300. That is, the apparatus in the present invention refers to an apparatus that includes the vibration wave driving apparatus 100 according to each embodiment and a driven member driven by a driving force from the vibration wave driving apparatus 100.

The above embodiment can provide a vibration wave driving apparatus that can maintain a good driving characteristic while suppressing the vibration of the holding member that holds the vibrator.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-011537, filed on Jan. 27, 2021, which is hereby incorporated by reference herein in its entirety.

What is claimed is:

1. A vibration wave driving apparatus comprising:
a vibrator configured to vibrate and movable relative to a friction member to generate a driving force;
a pressing member configured to pressurize the vibrator;
a transmission member configured to transmit a pressing force by the pressing member to the vibrator;
a holding member configured to hold the vibrator; and
a viscoelastic member configured to connect the holding member and the transmission member to each other,
wherein the transmission member includes at least three convex portions that contact the vibrator, and
wherein the at least three convex portions contact nodes different from those of a support portion of the vibrator among common nodes in which nodes in a plurality of standing wave vibrations excited by the vibrator intersect and overlap each other.

2. The vibration wave driving apparatus according to claim 1, wherein the viscoelastic member connects the holding member and the pressing member to each other.

3. The vibration wave driving apparatus according to claim 1, wherein the at least three convex portions are arranged symmetrically with respect to a centerline in a short side direction of the vibrator.

4. The vibration wave driving apparatus according to claim 1, wherein the holding member includes a connector connected to the viscoelastic member.

5. The vibration wave driving apparatus according to claim 4, wherein the connector has a concave shape when viewed from a first direction orthogonal to a pressurizing direction for pressurizing the vibrator.

6. The vibration wave driving apparatus according to claim 5, wherein the viscoelastic member is disposed between the holding member and the transmission member in a second direction orthogonal to the pressurizing direction and the first direction.

7. The vibration wave driving apparatus according to claim 4, wherein the connector has a shape configured to accommodate the viscoelastic member on a surface orthogonal to a pressurizing direction for pressurizing the vibrator along a direction orthogonal to the pressurizing direction.

8. The vibration wave driving apparatus according to claim 7, wherein the viscoelastic member is disposed between the holding member and the transmission member in the pressurizing direction.

9. An apparatus comprising:
a vibration wave driving apparatus; and
a driven member that is driven by a driving force from the vibration wave driving apparatus,
wherein the vibration wave driving apparatus includes:
a vibrator configured to vibrate and movable relative to a friction member to generate a driving force;
a pressing member configured to pressurize the vibrator;
a transmission member configured to transmit a pressing force by the pressing member to the vibrator;
a holding member configured to hold the vibrator; and
a viscoelastic member configured to connect the holding member and the transmission member to each other,
wherein the transmission member includes at least three convex portions that contact the vibrator, and
wherein the at least three convex portions contact nodes different from those of a support portion of the vibrator among common nodes in which nodes in a plurality of standing wave vibrations excited by the vibrator intersect and overlap each other.

10. The apparatus according to claim 9, wherein the apparatus is an optical apparatus that includes a lens.

\* \* \* \* \*